United States Patent [19]

Hoover et al.

[11] Patent Number: 4,653,034

[45] Date of Patent: Mar. 24, 1987

[54] REMOTE MONITOR UNIT

[75] Inventors: Dale H. Hoover, McConnellsburg; Lynn A. Poole, State College, both of Pa.

[73] Assignee: The United States of America as represented by the Secretary of the Navy, Washington, D.C.

[21] Appl. No.: 794,874

[22] Filed: Nov. 4, 1985

[51] Int. Cl.⁴ ............................................. H04B 11/00
[52] U.S. Cl. .................................. 367/131; 73/170 A; 367/135
[58] Field of Search .............. 367/131, 135; 73/170 A

[56] References Cited

U.S. PATENT DOCUMENTS 4,480,323 10/1984 Page ..................................... 367/131

Primary Examiner—Richard A. Farley
Attorney, Agent, or Firm—Arthur A. McGill; Michael J. McGowan; Prithvi C. Lall

[57] ABSTRACT

A remote monitor unit comprising a battery pack, a regulated power supply, a program control board, a receiver AD board, a plurality of memory boards and a transducer, all housed in a water tight enclosure. External control or data communication links are unnecessary with the remote monitor unit. Once the device has been activated and placed in its housing, a programmable time delay feature allows the user to place the unit at a selected site in advance of the start of the recording period without wasting any data storage capability. When deployed and activated, analog data from the transducer is converted to digital form and silently recorded by storing it in a non-volatile memory medium on the memory boards. The digitized information is later retrieved from the memory boards by micro, mini or main frame computer and stored on magnetic tape for subsequent processing. The memory boards are then erased by exposure to ultra-violet light and reused.

4 Claims, 3 Drawing Figures

REMOTE MONITOR UNIT

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION (1) Field of the Invention

The present invention relates to an apparatus for recording acoustic signals from an underwater transducer and more particularly to a self-powered, silent, digital storage device enclosed in a sealed case and having a preselectable time delay circuit and a relatively large storage capacity.

(2) Description of the Prior Art

Digital recording devices such as magnetic tape, magnetic disk, impact printer, thermal printer and paper punch are commonly used for permanently storing digital information until such data can be processed and analyzed. Each above storage medium has inherent advantages and disadvantages which affect selection for a particular end use. For example, when considering a digital recorder for use with a remote acoustic sensor, an important criteria is that the device not generate an acoustic signal during operation which would be detectable by its own sensor, thus adding an unwanted noise signal to the data or masking the sought information completely. Unfortunately, the above described recording devices all rely upon mechanical motion to store data, the motion being provided by either an electric motor or a solenoid. These mechanical devices though generate vibrations in the acoustic frequency range of the sensor and self-contaminate the information being recorded. What is desirable is a non-volitile data storage medium which records data silently.

SUMMARY OF THE INVENTION

Accordingly, it is a general purpose and object of the present invention to provide a monitor unit for sensing and recording acoustic signals. It is a further object that the monitor unit operate silently, i.e., not be a noise generator. Another object is that the recording medium be reusable. A still further object is that the unit have a selectable start-up time delay in order to permit remote deployment of the unit prior to commencement of the data storage cycle. Still another object is that the unit be housed in a case sealed against seawater egress.

These objects are accomplished with the present invention by providing a remote monitor unit comprising a battery pack, a regulated power supply, a program control board, a receiver A/D board, a plurality of memory boards and a transducer, all housed in a water tight enclosure. External control or data communication links are unnecessary with the remote monitor unit. Once the device has been activated and placed in its housing, a programmable time delay feature allows the user to place the unit at a selected site in advance of the start of the recording period without wasting any data storage capability. When deployed and activated, analog data from the transducer is converted to digital form and silently recorded by storing it in a non-volatile memory medium on the memory boards. The digitized information is later retrieved from the memory boards by micro, mini or main frame computer and stored on magnetic tape for subsequent processing. The memory boards are then erased by exposure to ultra-violet light and reused.

BRIEF DESCRIPTION OF THE DRAWINGS

A more complete understanding of the invention and many of the attendant advantages thereto will be readily appreciated as the same becomes better understood by reference to the following detailed description when considered in conjunction with the accompanying drawings wherein.

DESCRIPTION OF THE PREFERRED EMBODIMENT

Figure 1:
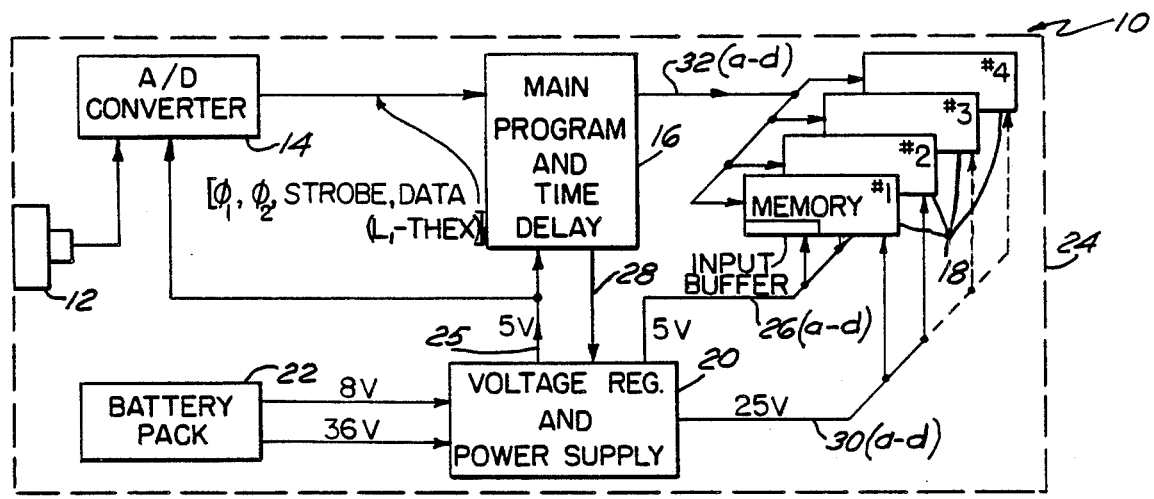
FIG. 1 shows a block diagram of the remote monitor unit of the present invention.

Referring now to FIG. 1 there is shown a monitor unit 10 for silently recording acoustic underwater signals for a preselected period, comprising an acoustic transducer 12, a receiver analog-to-digital (A/D) board 14, a main program/time delay board 16, a plurality of memory boards 18, a voltage regulator/power supply board 20, a battery pack 22, and a watertight housing 24.

Prior to unit 10 being sealed in watertight housing 24, a Dual Inline Package (DIP) switch on board 16 is set to provide the desired time delay from the moment the remote monitor unit is activated, i.e. just prior to sealing housing 24, until it starts recording. Between power-on and the instant that unit 10 starts recording, the voltage regulator/power supply board 20 is operational, supplying a regulated five volts D.C., 25, to A/D board 14 and to main program/time delay board 16. Memory boards 18 however do not have supply voltage available during the time delay interval, instead, each memory board 18 has its own five volt D.C. supply, 26(a–d), from board 20 which is enabled only during programming.

Transducer 12 and A/D board 14 receive and convert acoustic signals respectively into a corresponding eight-bit (one byte) word for storage by monitor unit 10. A clock on A/D board 14 provides the timing input $\phi_1$, e.g., one-half second pulses, to board 16 for driving the time delay circuit. When unit 10 has timed in, strobe pulses from A/D board 14 are gated to the main program circuitry of board 16. The strobe pulses indicate data is available for storage, the strobe period being selected to be commensurate with the desired data sampling rate, e.g., 500 millisecond pulses.

Main program board 16 uses the strobe pulses to latch data into a temporary register and to start the sequence of events necessary to store the data permanently on memory boards 18. Board 16 provides all of the control and addressing needed to transfer the data from the temporary register on board 16 to a permanent storage location on a selected memory board. The programming sequence starts by addressing, via connection 28, a pair of voltage regulators on power supply board 20. A five volt regulator is selected to provide logic supply voltage 26 ($a$–$d$) for the appropriate memory board 18; and a twenty-five volt supply, 30($a$–$d$), is used to provide the programming pulse.

With the selected memory board 18 powered-up, addressing information is provided via connection 32(a–d) for selecting the appropriate memory chip and the correct address on that chip. Upon completing the addressing, the twenty-five volt programming level 30(a–d) is applied and the data to be stored is made available.

Next, an enable pulse is sent by main program board 16 allowing the data to be stored. With the data stored, memory board 18 goes into a shutdown state until the next strobe pulse arrives from the A/D converter. Each available memory position is sequentially addressed on a particular board until that board is full and then the next board is selected. When all four boards have been filled unit 10 stops recording until it is reset manually by turning the power supply off and on again. Blank memory boards 18 must be installed for each new recording session beginning when remote monitor unit 10 is turned on. Recording over a previously recorded memory board without first completely erasing with ultraviolet light would result in meaningless data when finished.

Receiver A/D board 14 preconditions the analog signal from the transducer and converts it to an appropriate digital word using well known signal processing techniques. The receiver A/D board also provides the synchronizing clock pulses, $\phi_1$ and $\phi_2$, and the strobe signal for the entire systems's operation.

Figure 2:
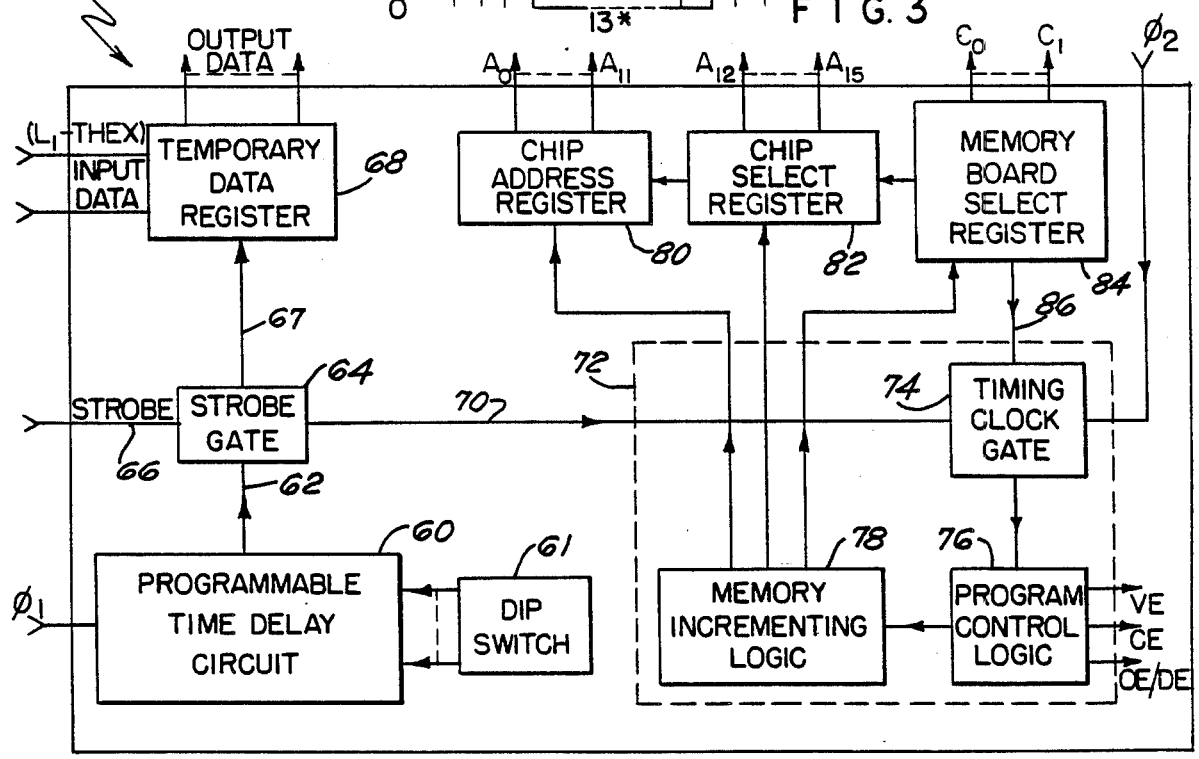
FIG. 2 shows a block diagram of the main program and time delay block of FIG. 1.

FIG. 2 shows a block diagram of the functions of main program/time delay board 16. Board 16 provides complete control and all the addressing necessary to record data onto memory boards 18.

$\phi_1$ is a one-half second clock used as the reference in the time delay circuit 60 whose delay is set with DIP switch 61. When the delay circuit has timed in, output 62 enables strobe gate 64. A strobe pulse 66 from A/D converter 14, via pulse 67, latches the input data $L_1$-THEX into a temporary data register 68 and starts, via pulse 70, the data recording sequence in the memory programming circuit 72.

Figure 3:
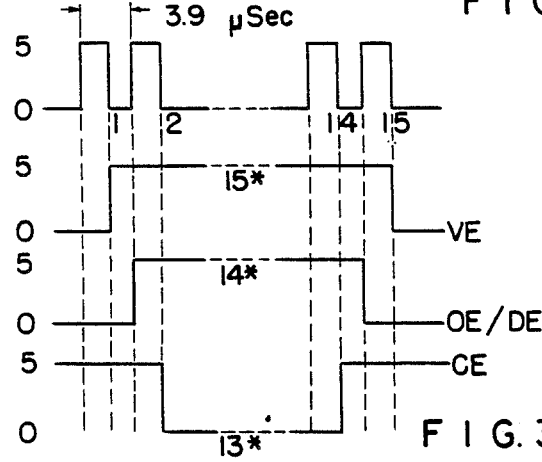
FIG. 3 shows the timing pulse waveform relationships which control the recording sequence of the unit of FIG. 1.

$\phi_2$ is a 3.9 millisecond clock pulse used for timing the program control logic. $\phi_2$ is fed via timing gate 74 to a ripple counter 76 whose output is appropriately gated to provide the outputs VE, OE/DE and CE. See FIG. 3 for the timing relationships of these outputs. The first negative edge of the clock pulse of $\phi_2$ causes VE to go high. VE enables five volt supply 26(a–d) to the memory boards. One-half clock period later, i.e. positive edge of second clock pulse, OE/DE goes high. OE/DE enables the 25 volt programming voltage supply to the memory board, and it allows the data to be gated through the front end of the memory board. Each memory board further includes a plurality of non-volatile memory chips such as Intel Corps. 2732 μV EPROMS or the like. One-half clock period after OE/DE goes high (negative edge of the second clock pulse), CE goes low. CE is low for 50.8 milliseconds during which time the data is being permanently stored onto a memory chip. CE, OE/DE, and VE return to their pre-programming states in opposite order with CE being first, OE/DE being second, and VE being third.

Upon completion of the data byte being stored, a pulse is sent via memory incrementing logic 78 to the address registers 80, 82 and 84 incrementing the counter to the next chip's address. Each successive chip is filled until the selected memory board is full. When the last memory board has been filled, the timing clock gate is disabled by signal 86, preventing further data from being recorded. The Remote Monitor Unit remains in this state until it is turned off. Table 1 below provides a listing of all the inputs and outputs of main program/time delay board 16.

In this exemplary preferred embodiment, each memory board 18 comprises sixteen INTEL 2732 μV EPROMS. Each EPROM is 4K×8 bits in size yielding a total memory size of 64K bytes per board. Using four boards thus provides 256K of total storage. Each EPROM has a standby and an active mode. The standby mode provides a reduction in energy (and hence battery) requirements. A "1 of 16" selector on each memory board decodes address lines $A_{12}$ through $A_{15}$ from main program board 16 to choose the appropriate EPROM. All the EPROM's remain in standby until input CE enables the "1 of 16" selector to activate the correct EPROM.

TABLE 1

MAIN PROGRAM & TIME DELAY CARD'S
I/O LISTING AND DESCRIPTIONS

| | | |
|---|---|---|
| 1. $\phi_1$ | | From A/D board 14, $\phi_1$ is the one-half second clock used for a reference in the time delay circuit. |
| 2. $\phi_2$ | | From A/D board 14, $\phi_2$ is the clock pulse for timing the program control logic. |
| 3. STROBE | | From A/D board 14, the strobe signals the main program board that data is available for storing. |
| 4. $L_1$-THEX | | From A/D board 14, $L_1$-THEX is input data to be stored in the temporary data register. |
| 5. $O_0$–$O_7$ | | Output to the memory boards, $O_0$–$O_7$ is the data from the temporary register to be stored on the 2732 memory chips. |
| 6. $A_0$–$A_{11}$ | | Output to the memory boards, $A_0$ through $A_{11}$ provides the present storage address on the chosen memory chip. |
| 7. $A_{12}$–$A_{15}$ | | Output to the memory boards, $A_{12}$ through $A_{15}$ chooses the appropriate chip. |
| 8. $C_0$ & $C_1$ | | Output to the power supply board, $C_0$ and $C_1$ select the pair of voltage regulators needed for the memory board in use. |
| 9. VE | | Output to the power supply board, VE turns on the five volt supply used by the memory board selected by $C_0$ and $C_1$. |
| 10. CE | | Output to the memory boards, CE enables the 2732 memory chip selection circuit allowing data storage to occur. |
| 11. OE/DE | | Output to both the memory boards and the power supply board, OE/DE gates the data to be stored onto the memory board and, also, enables the twenty-five volt programming supply selected by $C_0$ and $C_1$. |

To further reduce the drain on unit 10's batteries, each memory board 18 has its own five volt regulated supply, 26(a–d), which is turned on by VE for the 58.6 milliseconds necessary for the storage cycle. The twenty-five volt programming voltage, 30(a–d), is also only present for 54.7 miliseconds during the storage cycle. Both supplies remain off after completing the storage cycle for the remainder of the interval between sequential strobe pulses. For example, a strobe pulse may be selected to be 500 milliseconds in duration.

Three non-inverting CMOS buffers are included on the front end of each memory board 18 to prevent the system's address and control buses from being loaded down. Such loading would occur if the buses were tied to an unpowered chip that had a protection diode tied from its input to its now "OFF" zero voltage supply.

The data is gated "to" and "from" the memory boards by two CMOS bilateral switches. These two switches are powered from the system's five volt supply, 26(a–d), which is always present when the Remote Monitor Unit is turned on.

Each of the four memory boards 18 are identical except for the placement of jumper wires for the five volt and twenty-five volt supplies. The placement of each jumper wire codes each board as being board 1, board 2, board 3, or board 4. The system has only one board coded each way for a total of four boards. Board 1 is always recorded first and any additional recording time needed is met by the insertion of boards 2, 3 and 4 in that order. At 64K bytes and 500 millisecond recording rate for example, one board provides nine hours, six minutes and eight seconds worth of recording time for a total of approximately thirty-six and one-half hours for four boards.

After the memory boards are recorded, the information can be retrieved by removing the memory boards from the Remote Monitor Unit and plugging each one individually into an interface device connected to a mini, a micro or a main frame computer. The interface box provides all the power needed to operate the memory board and in addition matches the memory board to the logic levels required by the computer. Using the computer and well known software techniques, information is then selectively removed, evaluated and plotted. All information so obtained can be printed out onto paper or transferred to magnetic tape.

To prepare a used memory board for erasure and reuse, the entire board is placed under an ultra-violet light source. The computer is then used to verify the complete erasure of the board before reusing it.

Voltage regulator/power supply board 20 comprises a five volt commercial regulator, four switched five volt regulated supplies, four switched twenty-five volt regulated supplies, and the logic necessary to control the switching of the supplies. A five volt commercial regulator, such as an MC7805CT, provides power to the receiver A/D board, main program/time delay board, the two bilateral switches on each memory board, and the logic circuits on the power supply board. There are four pairs of switching supplies, each pair comprising of a five volt and a twenty-five volt regulated supply. $C_0$ and $C_1$ determine which pair is turned on. VE turns on the selected five volts supply and OE/DE turns on the selected twenty-five volt supply. The five volt supply has an output 5 V±0.1 VDC at 1 amp. The twenty-five volt supply has an output 25 V±0.5 VDC at 200 milliamps.

Battery pack 22 is an interchangeable unit comprising four rechargeable gel cells rated at 2 volts and 7.5 AH per cell. These four gel cells make up an eight volt supply for the various five volt regulators. The battery pack also contains eight nine-volt alkaline transistor batteries. The nine-volt batteries are connected so as to provide two parallel sets of batteries, each set comprising four batteries connected in series to provide a thirty-six volt supply for the four twenty-five volt regulators. The transistor batteries are replaced after each recording session. The battery drain current is as follows:

| | | |
|---|---|---|
| (1) TIME DELAY PERIOD | 8 V: | 16 mA |
| | 36 V: | 0 mA |
| (2) STANDBY BETWEEN PROGRAMMING | 8 V: | 16 mA |
| | 36 V: | 3 mA |
| (3) PROGRAMMING (STORAGE OF DATA) | 8 V: | 675 mA |
| | 36 V: | 150 mA |

The primary advantage of the remote monitor unit over existing recorders is the silent operation of the unit.

What has thus been described is a remote monitor unit comprising a battery pack, a regulated power supply, a program control board, a receiver A/D board, a plurality of memory boards and a transducer, all housed in a water tight enclosure. External control or data communication links are unnecessary with the remote monitor unit. Once the device has been activated and placed in its housing, a programmable time delay feature allows the user to place the unit at a selected site in advance of the start of the recording period without wasting any data storage capability. When deployed and activated, analog data from the transducer is converted to digital form and silently recorded by storing it in a non-volatile memory medium on the memory boards. The digitized information is later retrieved from the memory boards by micro, mini or main frame computer and stored on magnetic tape for subsequent processing. The memory boards are then erased by exposure to ultra-violet light and reused.

Obviously many modifications and variations of the present invention may become apparent in light of the above teachings. For example, bubble memory may be used in lieu of EPROMS, sampling rates may be varied and the total amount of memory may be increased without deviating from the teaching herein. Further, the gel cells are of ample capacity that a DC-DC converter may be used to replace the throw-away transistor batteries.

In light of the above, it is therefore understood that within the scope of the appended claims, the invention may be practiced otherwise than as specifically described.

What is claimed is:

1. An apparatus for receiving and silently storing acoustic signals from a remote source comprising:

transducer means, for sensing and converting said acoustic signals into corresponding analog electrical signals;

analog-to-digital (A/D) converter means, attached to said transducer means, for receiving said analog electrical signals, converting said analog electrical signals to corresponding digital data signals $L_1$-THEX and transmitting said digital signals, said A/D converter means further providing a strobe pulse, first system clock pulses $\phi_1$ and second system clock pulses $\phi_2$.

main program and time delay means, connected to said A/D converter means, for receiving said $\phi_1$, $\phi_2$, strobe and data outputs therefrom and controlling the storage of said data therewith, said main program and time delay means further comprising programmable time delay means, for receiving said first clock pulse $\phi_1$ and transmitting said first clock pulse after a preselected time delay, strobe gate means, for receiving said strobe pulse from said A/D converter means and said $\phi_1$ pulse from said time delay means and producing first and second output pulses therefrom, a temporary data register, connected to said strobe gate means and said A/D converter means, for receiving and storing said $L_1$-THEX data from said A/D converter means upon receiving said first output of said strobe gate means, memory programming control means, connected to said strobe gate means and said A/D converter means, for receiving said second output of said strobe gate means and said $\phi_2$ pulse from said A/D converter means, and producing address select and data storage outputs therefrom, and memory address select means, connected to said memory programming control means, for sequentially selecting addresses for storage of said $L_1$-THEX data;

non-volatile memory means, connected to said main program and time delay means, for receiving said address select and data storage outputs from said memory programming control means, and said sequential addresses from said memory address select means and selectively storing by burning in said data received therefrom, said non-volatile memory means further comprising a plurality of memory boards, each said memory board having an input buffer as an integral part thereof;

power supply means, connected to said A/D converter means, said main program means and said memory means, for controllably supplying preselected voltages thereto, said power supply means further comprising, a battery pack, for producing an 8 volt output and a 36 volt output, and voltage regulating means, connected to said battery pack 8 volt and 36 volt outputs, said A/D converter means, said main program means and said memory means, for producing a 25 volt output and a pair of 5 volt outputs respectively therefrom, said 25 volt output feeding said memory means, one said 5 volt output feeding each memory input buffer and the other said 5 volt output powering said A/D converter means and said main program means; and watertight housing means, enclosing said transducer means, said A/D converter means, said main program means, said memory means and said power supply means, for providing a watertight enclosure for said transducer means, said A/D coverter means, said main program means, said memory means and said power supply while exposing said transducer means to said acoustic field;

said apparatus operating so as to perform said data sensing and storage such that no self-noise produced thereby contaminates said acoustic signals.

2. An apparatus according to claim 1 wherein said programmable time delay means is a Dual Inline Package (DIP) switch.

3. An apparatus according to claim 2 wherein said memory programming control means further comprises:

a timing clock gate, connected to said strobe gate, for receiving said strobe signal and said $\phi_2$ input from said A/D converter means;

program control logic means, connected to said timing clock gate, for receiving the output thereof and producing as output signals, an incrementing pulse, VE, CE, and OE/DE in response thereto; and memory incrementing logic, connected to said program control logic means for receiving said incrementing pulse and incrementing said memory address select means.

4. An apparatus according to claim 3 wherein said memory address select means further comprises:

a memory board select register, connected to said memory incrementing logic, for receiving the incrementing pulse therefrom and sequentially selecting a memory board therewith;

a chip select register, connected to said memory incrementing logic and said memory board select register, for sequentially selecting a desired memory chip; and a chip address register connected to said memory incrementing logic and said chip select register, for sequentially selecting a desired address on a chosen memory chip.

* * * * *